US010847710B2

(12) United States Patent
Hioka et al.

(10) Patent No.: US 10,847,710 B2
(45) Date of Patent: Nov. 24, 2020

(54) SEMICONDUCTOR DEVICE (71) Applicant: ABLIC Inc., Chiba (JP)

(72) Inventors: Takaaki Hioka, Chiba (JP); Tomoki Hikichi, Chiba (JP)

(73) Assignee: ABLIC Inc., Chiba (JP)

( * ) Notice: Subject to any disclaimer, the term of this patent is extended or adjusted under 35 U.S.C. 154(b) by 17 days.

(21) Appl. No.: 16/364,128

(22) Filed: Mar. 25, 2019

(65) Prior Publication Data

US 2019/0296227 A1 Sep. 26, 2019

(30) Foreign Application Priority Data

Mar. 26, 2018 (JP) .................... 2018-058445

(51) Int. Cl.
*H01L 43/06* (2006.01)
*H01L 27/22* (2006.01)
*G01R 33/07* (2006.01)
*H01L 43/04* (2006.01)
*H01L 49/02* (2006.01)

(52) U.S. Cl.
CPC .......... *H01L 43/065* (2013.01); *G01R 33/077* (2013.01); *H01L 27/22* (2013.01); *H01L 28/20* (2013.01); *H01L 43/04* (2013.01)

(58) Field of Classification Search
CPC combination set(s) only.
See application file for complete search history.

(56) References Cited

U.S. PATENT DOCUMENTS

2014/0028304 A1* 1/2014 Ausserlechner ....... G01R 19/25
324/251
2016/0139214 A1* 5/2016 Ausserlechner ..... G01R 33/077
324/251

FOREIGN PATENT DOCUMENTS

| EP | 1438755 | 1/2005 |
|----|---------|--------|
| EP | 2071347 | 6/2009 |
| WO | 2004025742 | 3/2004 |

OTHER PUBLICATIONS

"Search Report of Europe Counterpart Application", dated Nov. 18, 2019, p. 1-p. 7.

* cited by examiner

*Primary Examiner* — Ratisha Mehta
(74) *Attorney, Agent, or Firm* — JCIPRNET (57) ABSTRACT The semiconductor device includes a vertical Hall element that is provided in a first region of a semiconductor substrate and has a plurality of first electrodes, and a resistive element that is provided in a second region different from the first region in the semiconductor substrate and has a plurality of second electrodes. The plurality of first electrodes and the plurality of second electrodes are connected so that resistances of current paths are substantially the same in any phase in which the vertical Hall element is driven using a spinning current method.

10 Claims, 11 Drawing Sheets

SEMICONDUCTOR DEVICE

CROSS-REFERENCE TO RELATED APPLICATION

This application claims the priority of Japan patent application serial no. 2018-058445, filed on Mar. 26, 2018. The entirety of the above-mentioned patent application is hereby incorporated by reference herein and made a part of this specification.

BACKGROUND OF THE INVENTION

Technical Field

The invention relates to a semiconductor device, and specifically, to a semiconductor device including a vertical Hall element configured to detect a magnetic field in a horizontal direction.

Description of Related Art

Hall elements can detect a position and an angle in a non-contact manner as magnetic sensors and thus can be used for various applications. Among these, while magnetic sensors using a horizontal Hall element configured to detect a magnetic field component perpendicular to a surface of a semiconductor substrate (vertical magnetic field) are generally well known, various magnetic sensors using a vertical Hall element configured to detect a magnetic field component parallel to the surface of the substrate (horizontal magnetic field) are also proposed.

Since it is difficult for vertical Hall elements to have a structure having high geometric symmetry, even at the absence of a magnetic field, a so-called offset voltage equal to or higher than that of horizontal Hall elements is likely to be generated. Thus, when used in magnetic sensors, it is necessary to remove such an offset voltage, and as a method therefor, spinning current method is known.

As a method of removing an offset voltage using the spinning current method, a method in which a direction of a flow of a drive current is switched among four directions in a vertical Hall element including five electrodes disposed at intervals on a straight line on a surface of a semiconductor substrate, while a magnetic field is applied in a direction parallel to the semiconductor substrate is known (for example, refer to FIG. 1 in European Patent No. 1438755). In this method, the offset voltage is removed by addition and subtraction among the first to fourth output signals obtained as follows: the first output signal is a potential difference generated between two electrodes positioned on both sides of the central electrode when a drive current flows from the central electrode to the electrodes at both ends (called a first phase); the second output signal is a potential difference generated between two electrodes positioned on both sides of the central electrode when a drive current flows in a direction opposite to that in the first phase (called a second phase); the third output signal is a potential difference generated between the central electrode and electrodes at both ends when a drive current flows from one of two electrodes positioned on both sides of the central electrode to the other thereof (called a third phase); and the fourth output signal is a potential difference generated between the central electrode and electrodes at both ends when a drive current flows in a direction opposite to that in the third phase (called a fourth phase).

However, in the above method, since a resistance along the current path in the first and second phases is different from a resistance along the current path in the third and fourth phases, an offset voltage removal accuracy is not very high.

SUMMARY OF THE INVENTION

The present invention provides a semiconductor device including a vertical Hall element that can remove an offset voltage according to the spinning current method with high accuracy.

A semiconductor device according to one embodiment of the invention includes a vertical Hall element that is provided in a first region of a semiconductor substrate and includes a first plurality of electrodes disposed at intervals on a first straight line; and a resistive element that is provided in a second region different from the first region of the semiconductor substrate and includes a second plurality of electrodes disposed at intervals on a second straight line. The first plurality of electrodes and the second plurality of electrodes are connected so that resistances along each current path are substantially the same in any phase during driving of the vertical Hall element by the spinning current method.

According to one or some exemplary embodiments of the invention, the vertical Hall element and the resistive element are disposed as separate elements on the semiconductor substrate, and the plurality of electrodes of the vertical Hall element and the plurality of electrodes of the resistive element are connected so that resistances along each current path are substantially the same in any phase during driving of the vertical Hall element by the spinning current method. It is therefore possible to remove an offset voltage with high accuracy using the spinning current method.

DESCRIPTION OF THE EMBODIMENTS

Embodiments for implementing the invention will be described below in detail with reference to the drawings.

First Embodiment

The first embodiment will be described with reference to FIG. 1 to FIG. 5.

Figure 1:
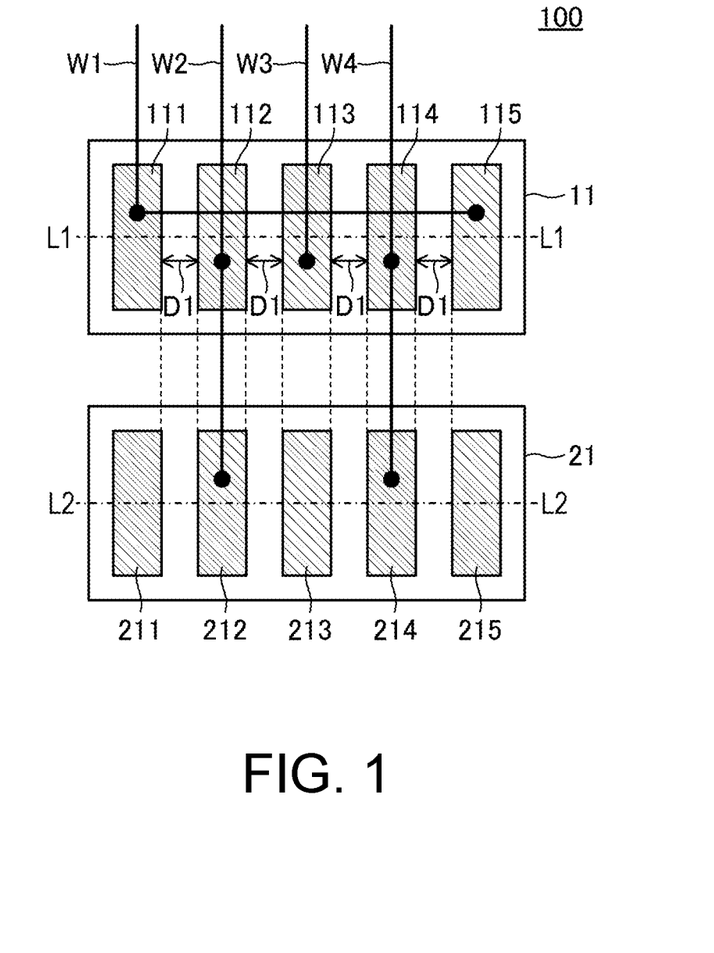
FIG. 1 is a schematic plan view for explaining a semiconductor device including a vertical Hall element according to the first embodiment.

FIG. 1 is a schematic plan view for explaining a semiconductor device 100 including a vertical Hall element according to the first embodiment.

As shown in FIG. 1, the semiconductor device 100 of the present embodiment includes a vertical Hall element 11 and a resistive element 21. The vertical Hall element 11 includes a plurality of electrodes 111 to 115 disposed at intervals on a straight line L1-L1. The resistive element 21 includes a plurality of electrodes 211 to 215 disposed at intervals on a straight line L2-L2.

In the semiconductor device 100 of the present embodiment, the electrodes 111 to 115 of the vertical Hall element 11 and the electrodes 211 to 215 of the resistive element 21 are disposed so that intervals between adjacent electrodes are all D1, and the vertical Hall element 11 and the resistive element 21 have substantially the same structure.

In addition, for the vertical Hall element 11, a conductive line W1 is connected to the electrode 111 and the electrode 115, a conductive line W2 is connected to the electrode 112, a conductive line W3 is connected to the electrode 113, and a conductive line W4 is connected to the electrode 114. In this state, which is not shown and in which the resistive element 21 is not connected to the vertical Hall element 11, a resistance between the electrode 113 and the electrodes 111 and 115 of the vertical Hall element 11 is smaller than a resistance between the electrode 112 and the electrode 114.

In the present embodiment, as shown in FIG. 1, the electrode 212 of the resistive element 21 is connected to the electrode 112 of the vertical Hall element 11 with the conductive line W2 and the electrode 214 of the resistive element 21 is connected to the electrode 114 of the vertical Hall element 11 with the conductive line W4.

In this manner, in order to explain the effect obtained by connecting the resistive element 21 to the vertical Hall element 11, a method of driving the vertical Hall element 11 using the spinning current method in the semiconductor device 100 will be described below in detail.

Figure 2:
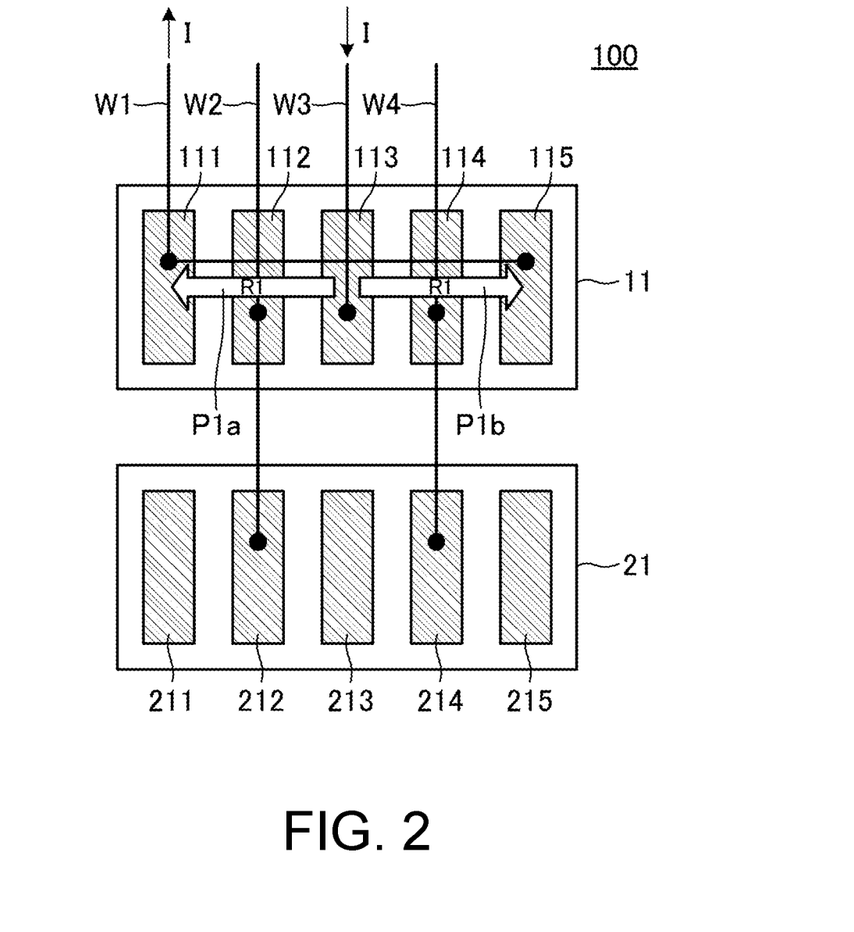
FIG. 2 is a schematic plan view for explaining a current path in which a direction of a current flowing through the vertical Hall element is set to a first state (a phase 1) in execution of the spinning current method in the semiconductor device shown in FIG. 1 is performed.
Figure 3:
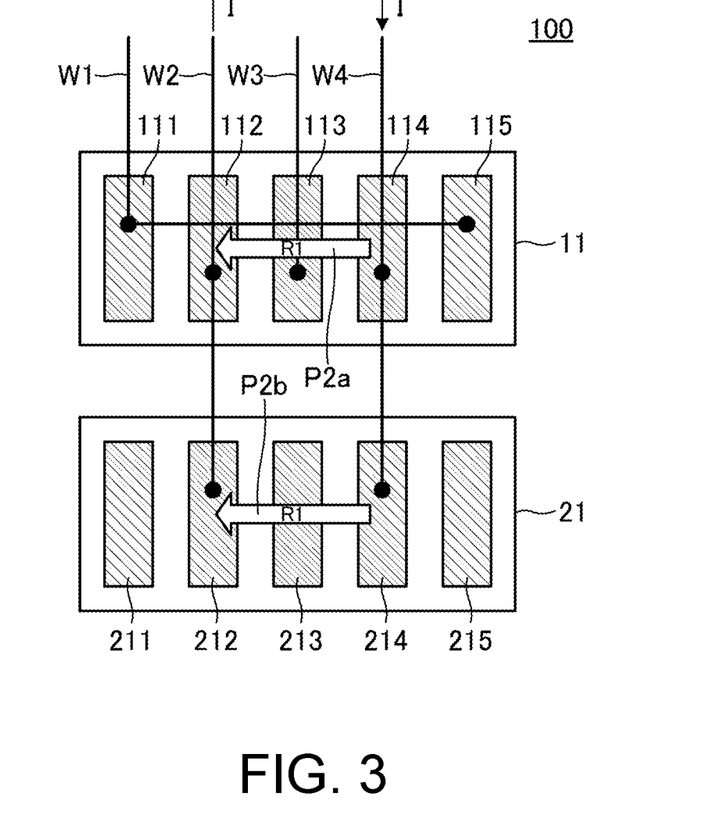
FIG. 3 is a schematic plan view for explaining a current path in which a direction of a current flowing through the vertical Hall element is set to a second state (a phase 2) in execution of the spinning current method in the semiconductor device shown in FIG. 1 is performed.

FIG. 2 and FIG. 3 are schematic plan views for explaining a current path in which a direction of a current flowing through the vertical Hall element 11 is set to a first state (a phase 1) and a second state (a phase 2) in execution of the spinning current method in the semiconductor device 100.

Figure 4:
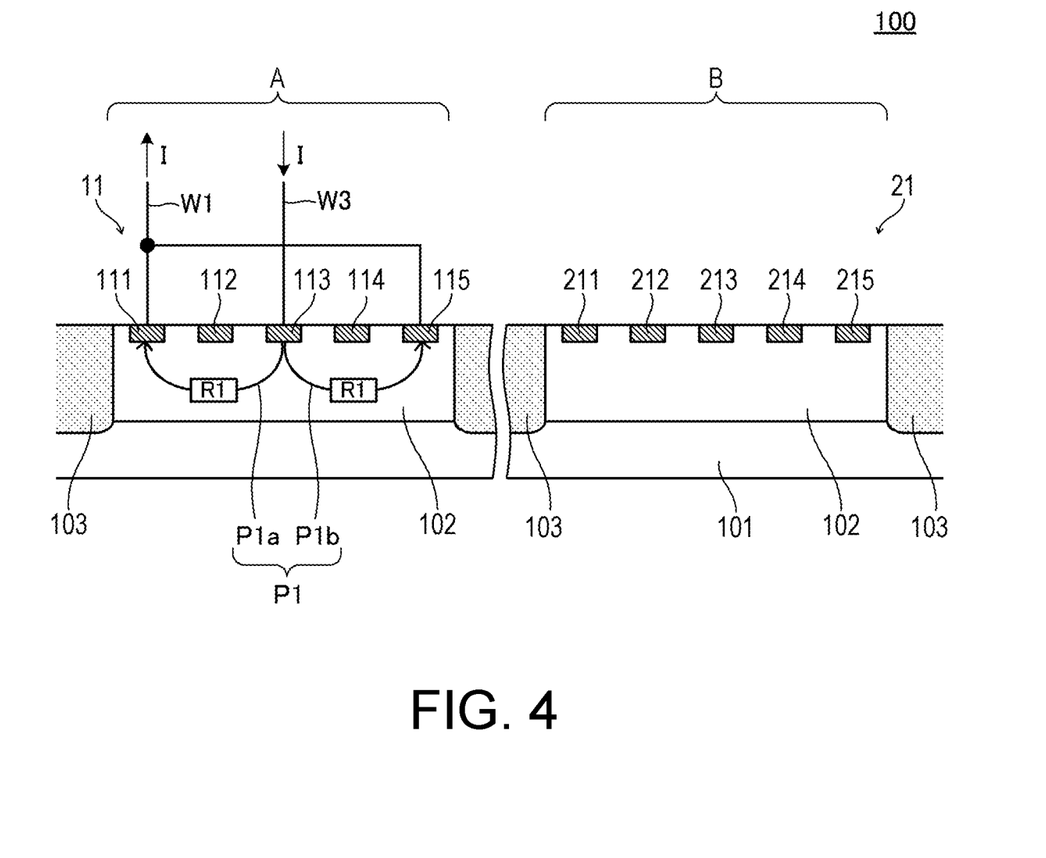
FIG. 4 is a schematic cross-sectional view for explaining a current path when a direction of a current flowing through the vertical Hall element is set to the first state (the phase 1) in execution of the spinning current method in the semiconductor device shown in FIG. 1 is performed.
Figure 5:
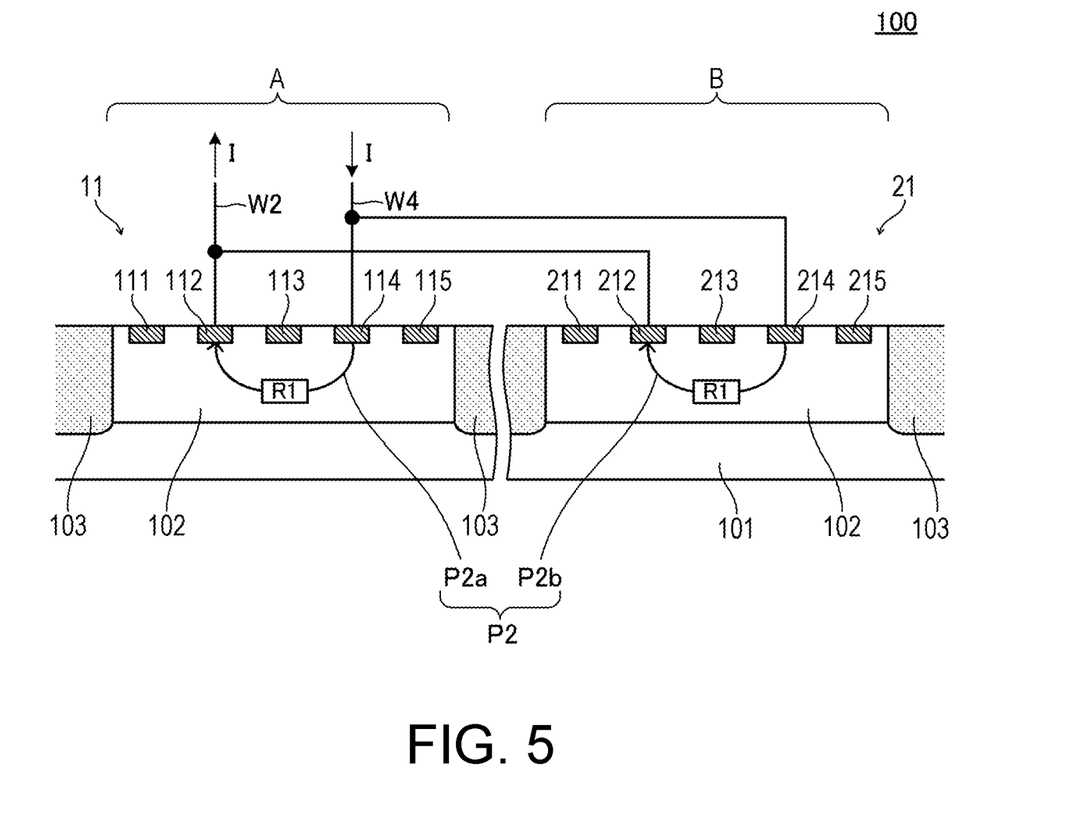
FIG. 5 is a schematic cross-sectional view for explaining a current path when a direction of a current flowing through the vertical Hall element is set to the second state (the phase 2) in execution of the spinning current method in the semiconductor device shown in FIG. 1 is performed.

In addition, FIG. 4 and FIG. 5 are diagrams schematically showing a cross-sectional structure of the device of the vertical Hall element 11 along the line L1-L1 shown in FIG. 1 and a cross-sectional structure of the device of the resistive element 21 along the line L2-L2, and FIG. 4 corresponds to the phase 1 shown in FIG. 2 and FIG. 5 corresponds to the phase 2 shown in FIG. 3.

As shown in FIG. 4 and FIG. 5, the vertical Hall element 11 and the resistive element 21 are formed in regions A and B of a P type (first conductive type) semiconductor substrate 101. The region A and the region B are electrically separated from each other due to a P type element isolation diffusion layer 103 formed on an N type (second conductive type) semiconductor layer 102 provided on the semiconductor substrate 101. The electrodes 111 to 115 of the vertical Hall element 11 and the electrodes 211 to 215 of the resistive element 21 are made of an N type impurity region with a higher concentration than the semiconductor layer 102 provided adjacent to a surface of the semiconductor layer 102 in the regions A and B.

As shown in FIG. 2 and FIG. 4, in the phase 1, the drive current I is supplied from the conductive line W3 to the conductive line W1 so that the current flows from the electrode 113 to the electrode 111 and to the electrode 115 of the vertical Hall element 11. A current path P1 in the phase 1 is constructed from a current path P1$a$ along which current flows from the electrode 113 to the electrode 111 and a current path P1$b$ along which current flows from the electrode 113 to the electrode 115 both of which are connected in parallel. In the present embodiment, in the electrodes 111 to 115 of the vertical Hall element 11 and the electrodes 211 to 215 of the resistive element 21, intervals between adjacent electrodes are all D1, and thus resistances between electrodes positioned on both sides of one electrode are substantially the same, and the resistances are set as R1 here. Here, the resistances R1 are not completely the same due to variation or the like in a semiconductor producing process, but they can be regarded as substantially the same. The resistance of the current path P1 is a parallel resistance of the resistance R1 of the current path P1$a$ and the resistance R1 of the current path P1$b$, and therefore becomes R1/2. In this case, a potential difference generated between the conductive line W2 and the conductive line W4, that is, between the electrode 112 and the electrode 114 of the vertical Hall element 11, is set as an output signal in the phase 1.

On the other hand, as shown in FIG. 3 and FIG. 5, in the phase 2, the drive current I is supplied from the conductive line W4 to the conductive line W2 so that the current flows from the electrode 114 to the electrode 112 of the vertical Hall element 11. A current path P2 in the phase 2 is no constructed from only a current path P2$a$ along which current flows from the electrode 114 to the electrode 112 in the vertical Hall element 11, but is also constructed from a current path P2$b$ along which current flows from the electrode 214 to the electrode 212 in the resistive element 21 both of which are connected in parallel. The resistance of the current path P2 is a parallel resistance of the resistance R1 of the current path P2$a$ and the resistance R1 of the current path P2$b$, and therefore becomes R1/2. That is, the resistance of the current path P2 can be made equal to the resistance of the current path P1 in the phase 1. In this case, a potential difference generated between the conductive line W1 and the conductive line W3, that is, between the electrode 113, and the electrodes 111 and 115 of the vertical Hall element 11, is set as an output signal in the phase 2.

In addition, although not shown, a resistance of a current path P3 in a third state (a phase 3) in which the drive current I is supplied to the vertical Hall element 11 in a direction opposite to that in the phase 1 shown in FIG. 2 and FIG. 4 can be made equal to the resistances of the current path P1 and the current path P2. In this case, a potential difference generated between the conductive line W2 and the conductive line W4, that is, between the electrode 112 and the electrode 114 of the vertical Hall element 11, is set as an output signal in the phase 3. In addition, a resistance of a current path P4 in a fourth state (a phase 4) in which the drive current I is supplied to the vertical Hall element 11 in a direction opposite to that in the phase 2 shown in FIG. 3 and FIG. 5 can be made equal to the resistances of the current paths P1, P2, and P3. In this case, a potential difference generated between the conductive line W1 and the conductive line W3, that is, between the electrodes 111 and 115, and the electrode 113 of the vertical Hall element 11, is set as an output signal in the phase 4.

In this manner, according to the present embodiment, the electrode 212 of the resistive element 21 is connected to the electrode 112 of the vertical Hall element 11, and the electrode 214 of the resistive element 21 is connected to the electrode 114 of the vertical Hall element 11. All of the resistance of the current path P1 in the phase 1, the resistance of the current path P2 in the phase 2, the resistance of the current path P3 in the phase 3, and the resistance of the current path P4 in the phase 4 can thus be made substantially equal to each other.

Addition and subtraction of the four output signals obtained from each of the phases enables removal of the offset voltage with high accuracy.

Second Embodiment

The second embodiment will be described with reference to FIG. 6 to FIG. 8.

A case in which intervals between adjacent electrodes in the vertical Hall element are constant (all D1) has been exemplified in the first embodiment. On the other hand, in the present embodiment, an example will be described in which resistances of current paths in phases are made equal in execution of the spinning current method when the intervals between adjacent electrodes in a vertical Hall element are not constant.

Figure 6:
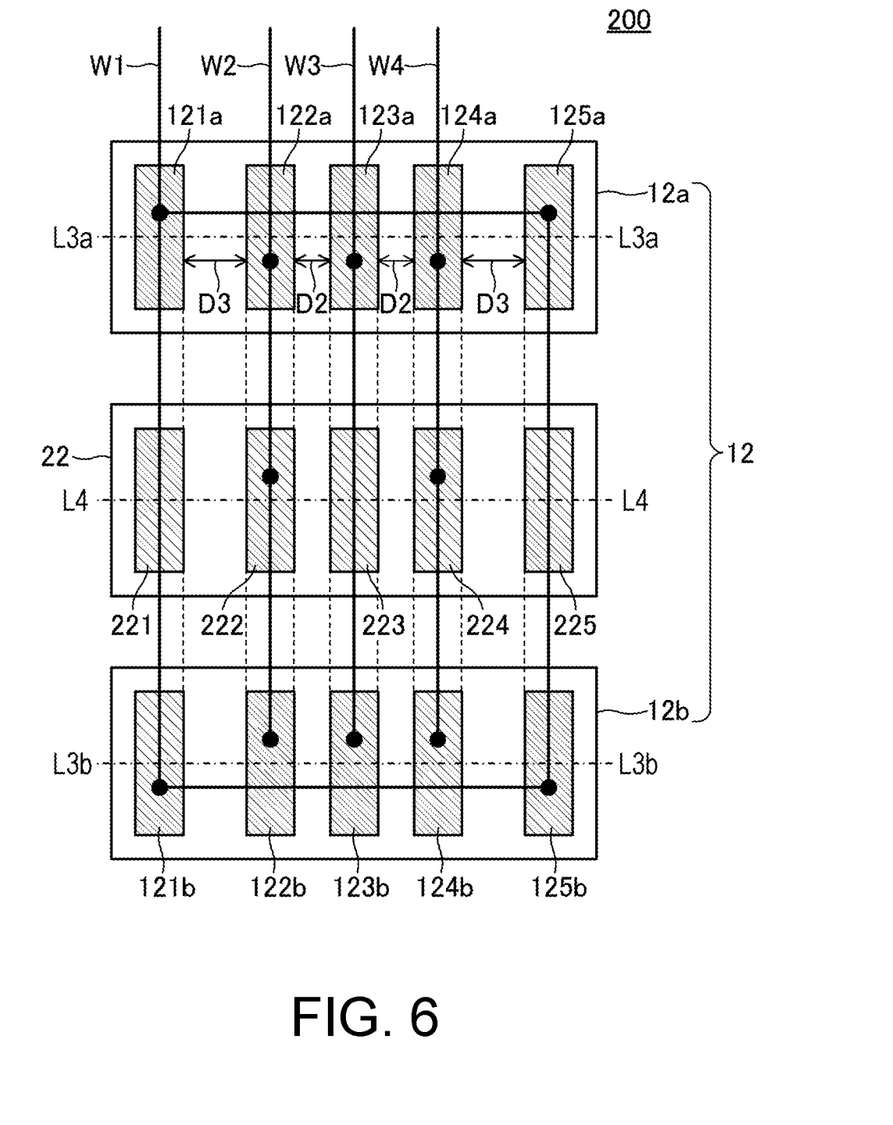
FIG. 6 is a schematic plan view for explaining a semiconductor device including a vertical Hall element according to the second embodiment.

FIG. 6 is a schematic plan view for explaining a semiconductor device 200 including a vertical Hall element according to the second embodiment.

As shown in FIG. 6, the semiconductor device 200 of the present embodiment includes a vertical Hall element 12 and a resistive element 22. The vertical Hall element 12 has a vertical Hall element part 12a including a plurality of electrodes 121a to 125a disposed at intervals on a straight line L3a-L3a, and a vertical Hall element part 12b including a plurality of electrodes 121b to 125b disposed at intervals on a straight line L3b-L3b. The resistive element 22 includes a plurality of electrodes 221 to 225 disposed at intervals on a straight line L4-L4.

In the semiconductor device 200 of the present embodiment, the electrodes 121a to 125a of the vertical Hall element part 12a, the electrodes 121b to 125b of the vertical Hall element part 12b, and the electrodes 221 to 225 of the resistive element 22 are disposed so that intervals between three adjacent electrodes at the center are all D2, and intervals between electrodes at both ends and one electrode on the inner side are all D3 which is larger than D2, and the vertical Hall element part 12a, the vertical Hall element part 12b, and the resistive element 22 have substantially the same structure.

In addition, for the vertical Hall element parts 12a and 12b, the conductive line W1 is connected to the electrodes 121a, 121b, 125a, and 125b, the conductive line W2 is connected to the electrodes 122a and 122b, the conductive line W3 is connected to the electrodes 123a and 123b, and the conductive line W4 is connected to the electrodes 124a and 124b. In this state, which is not shown and in which the resistive element 22 is not connected to the vertical Hall element 12, a resistance between the electrodes 123a and 123b of the vertical Hall element 12, and the electrodes 121a and 121b and the electrodes 125a and 125b is smaller than a resistance between the electrodes 122a and 122b and the electrodes 124a and 124b.

In the present embodiment, as shown in FIG. 6, the electrode 222 of the resistive element 22 is connected to the electrodes 122a and 122b of the vertical Hall element 12 with the conductive line W2, and the electrode 224 of the resistive element 22 is connected to the electrodes 124a and 124b of the vertical Hall element 12 with the conductive line W4.

In this manner, in order to explain the effect obtained by connecting the resistive element 22 to the vertical Hall element 12, a method of driving the vertical Hall element 12 using the spinning current method in the semiconductor device 200 will be described below in detail.

Figure 7:
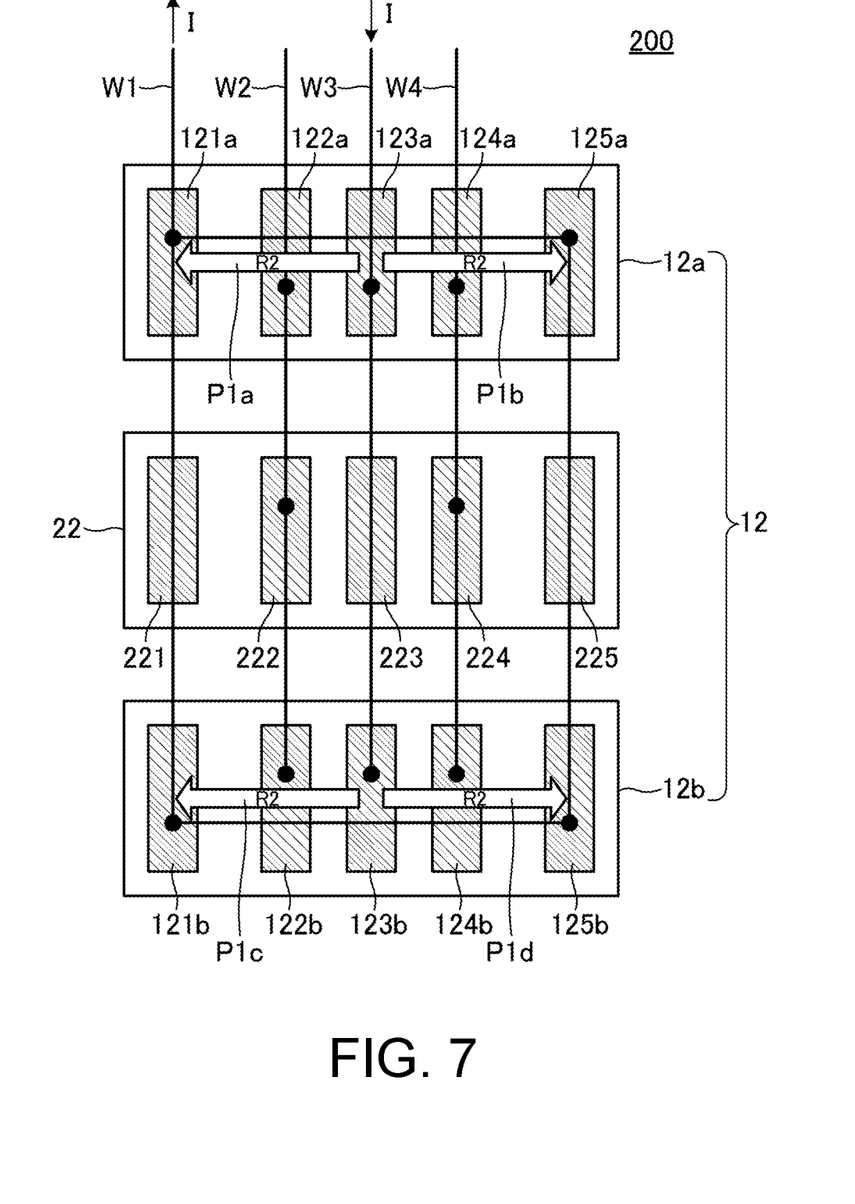
FIG. 7 is a schematic plan view for explaining a current path in which a direction of a current flowing through the vertical Hall element is set to a first state (a phase 1) in execution of the spinning current method in the semiconductor device shown in FIG. 6 is performed.
Figure 8:
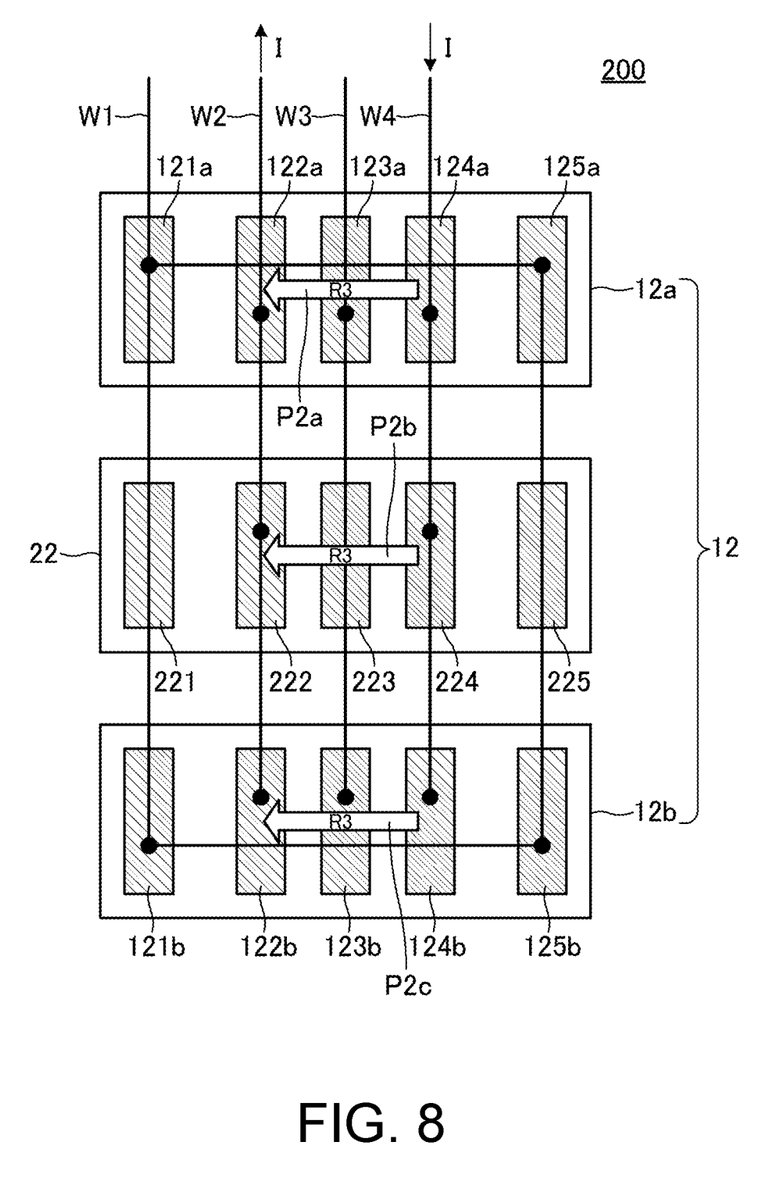
FIG. 8 is a schematic plan view for explaining a current path in which a direction of a current flowing through the vertical Hall element is set to a second state (a phase 2 in execution of the spinning current method in the semiconductor device shown in FIG. 6 is performed.

FIG. 7 and FIG. 8 are schematic plan views for explaining a current path in which a direction of a current flowing through the vertical Hall element 12 is set to a first state (a phase 1) and a second state (a phase 2) in execution of the spinning current method in the semiconductor device 200.

Here, cross-sectional structures of devices of the vertical Hall element part 12a, the vertical Hall element part 12b, and the resistive element 22 in the present embodiment are substantially the same as those of the vertical Hall element 11 and the resistive element 21 in the first embodiment shown in FIG. 4 and FIG. 5 except for different intervals between electrodes, and descriptions thereof will be omitted here.

As shown in FIG. 7, in the phase 1, the drive current I is supplied from the conductive line W3 to the conductive line W1 so that the current flows from the electrodes 123a and 123b to the electrodes 121a and 121b, and the electrodes 125a and 125b of the vertical Hall element 12. The current path P1 in the phase 1 is constructed from the current path P1a along which current flows from the electrode 123a to the electrode 121a in the vertical Hall element part 12a, the current path P1b along which current flows from the electrode 123a to the electrode 125a in the vertical Hall element part 12a, a current path P1c along which current flows from the electrode 123b to the electrode 121b in the vertical Hall element part 12b, and a current path P1d along which current flows from the electrode 123b to the electrode 125b in the vertical Hall element part 12b, all of which are connected in parallel.

In the present embodiment, since the electrodes 121a to 125a of the vertical Hall element part 12a, the electrodes 121b to 125b of the vertical Hall element part 12b, and the electrodes 221 to 225 of the resistive element 22 are disposed at the intervals described above, a distance between the central electrodes 123a, 123b, and 223 in one vertical Hall element part or the resistive element and the electrodes 121*a*, 121*b*, and 221, or 125*a*, 125*b*, and 225 at the end is longer than a distance between electrodes positioned on both sides of the central electrode (between 122*a* and 124*a*, between 122*b* and 124*b*, and between 222 and 224). The resistance between the central electrode and the electrode at the end is larger than the resistance between electrodes positioned on both sides of the central electrode. These resistances are substantially the same and are set as R2 here.

The resistance of the current path P1 is a parallel resistance of the resistance R2 of the current path P1*a*, the resistance R2 of the current path P1*b*, the resistance R2 of the current path P1*c*, and the resistance R2 of the current path P1*d*, and therefore becomes R2/4. In this case, a potential difference generated between the conductive line W2 and the conductive line W4, that is, between the electrodes 122*a* and 122*b*, and the electrodes 124*a* and 124*b* of the vertical Hall element 12, is set as an output signal in the phase 1.

On the other hand, as shown in FIG. 8, in the phase 2, the drive current I is supplied from the conductive line W4 to the conductive line W2 so that the current flows from the electrodes 124*a* and 124*b* to the electrodes 122*a* and 122*b* of the vertical Hall element 12. The current path P2 in the phase 2 is constructed from the current path P2*a* along which current flows from the electrode 124*a* to the electrode 122*a* in the vertical Hall element part 12*a*, the current path P2*b* along which current flows from the electrode 224 to the electrode 222 in the resistive element 22, and a current path P2*c* along which current flows from the electrode 124*b* to the electrode 122*b* in the vertical Hall element part 12*b*, all of which are connected in parallel.

In the present embodiment, as described above, the resistance between electrodes positioned on both sides of the central electrode is smaller than the resistance R2 between the central electrode and the electrode at the end. These resistances are substantially the same and are set as R3 here. In addition, R2:R3=4:3 is supposed.

The resistance of the current path P2 is a parallel resistance of the resistance R3 of the current path P2*a*, the resistance R3 of the current path P2*b*, and the resistance R3 of the current path P2*c*, and therefore becomes R3/3. As described above, since R2:R3=4:3 is supposed, the resistance R3/3 of the current path P2 in the phase 2 can be made equal to the resistance R2/4 of the current path P1 in the phase 1. In this case, a potential difference generated between the conductive line W1 and the conductive line W3, that is, between the electrodes 121*a* and 121*b* and 125*a* and 125*b*, and the electrodes 123*a* and 123*b* of the vertical Hall element 12, is set as an output signal in the phase 2.

In addition, although not shown, the resistance of the current path P3 in the third state (a phase 3) in which the drive current is supplied to the vertical Hall element 12 in a direction opposite to that of the phase 1 shown in FIG. 7 can be made equal to resistances of the current path P1 and the current path P2. In this case, a potential difference generated between the conductive line W2 and the conductive line W4, that is, between the electrodes 122*a* and 122*b*, and the electrodes 124*a* and 124*b* of the vertical Hall element 12, is set as an output signal in the phase 3. In addition, the resistance of the current path P4 in the fourth state (a phase 4) in which the drive current is supplied to the vertical Hall element 12 in a direction opposite to that of the phase 2 shown in FIG. 8 can be made equal to resistances of the current paths P1, P2, and P3. In this case, a potential difference generated between the conductive line W1 and the conductive line W3, that is, between the electrodes 121*a* and 121*b* and 125*a* and 125*b*, and the electrodes 123*a* and 123*b* of the vertical Hall element 12, is set as an output signal in the phase 4.

In this manner, according to the present embodiment, since the electrode 222 of the resistive element 22 is connected to the electrodes 122*a* and 122*b* of the vertical Hall element 12 and the electrode 224 of the resistive element 22 is connected to the electrodes 124*a* and 124*b* of the vertical Hall element 12, all of the resistance of the current path P1 in the phase 1, the resistance of the current path P2 in the phase 2, the resistance of the current path P3 in the phase 3, and the resistance of the current path P4 in the phase 4 can be made substantially equal to each other.

In the present embodiment also, addition and subtraction of the four output signals obtained from each of the phases enables removal of the offset voltage with high accuracy.

Third Embodiment

The third embodiment will be described with reference to FIG. 9 to FIG. 11.

In the first and second embodiments, examples have been described in which a resistive element is appropriately connected to the vertical Hall element so that a current path is added in parallel to a current path having a larger resistance, thereby reducing the resistance of the current path having a larger resistance substantially to coincide with the resistance of the current path having a smaller resistance in two different current paths among four phases in execution of the spinning current method in the vertical Hall element resistive element. On the other hand, in the present embodiment, an example is described in which a resistive element is appropriately connected to the vertical Hall element so that current paths are added in series to a current path having a smaller resistance, and thus a resistance of a current path having a smaller resistance is substantially increased to coincide with a resistance of a current path having a larger resistance.

Figure 9:
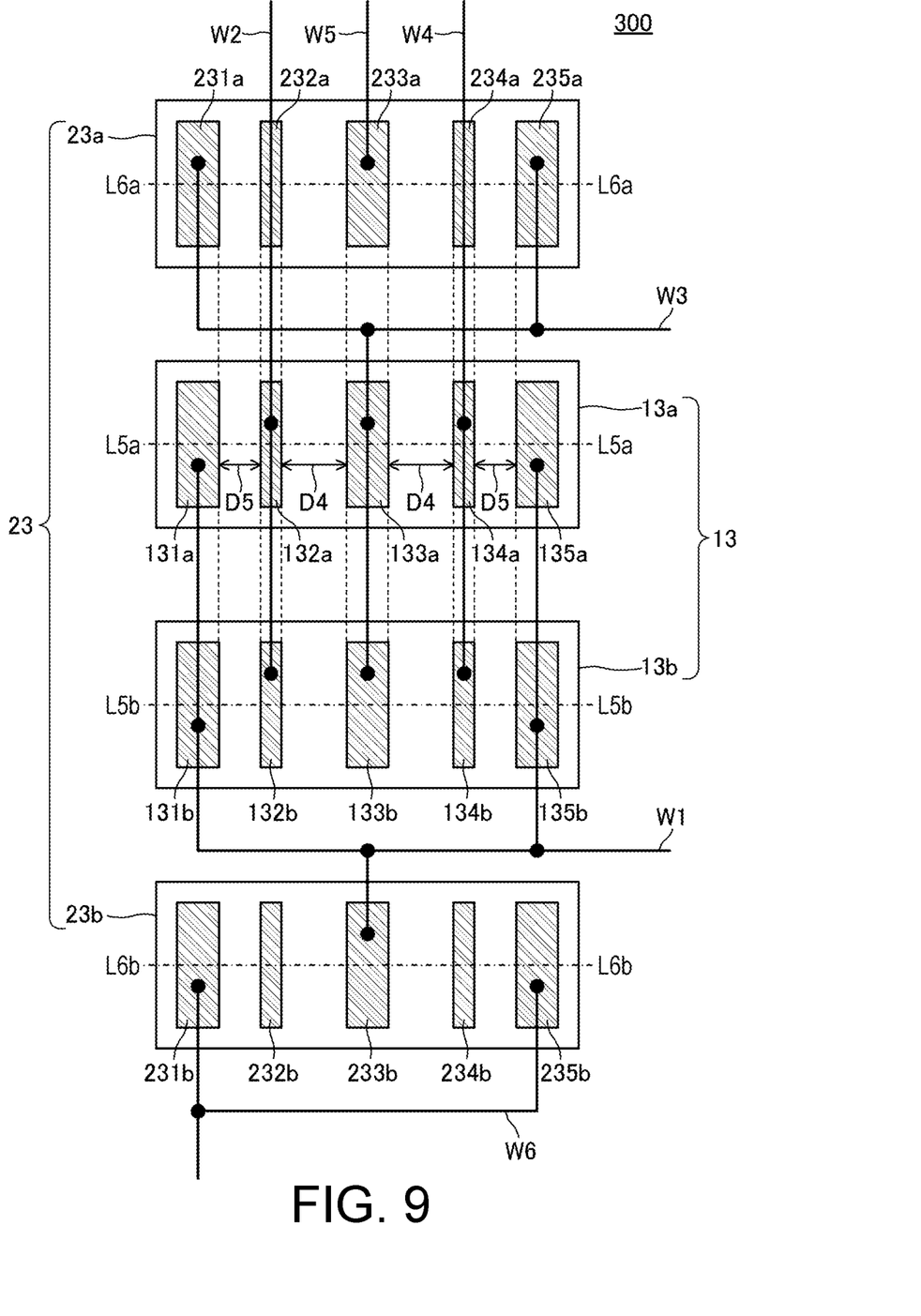
FIG. 9 is a schematic plan view for explaining a semiconductor device including a vertical Hall element according to the third embodiment.

FIG. 9 is a schematic plan view for explaining a semiconductor device 300 including the vertical Hall element according to the third embodiment.

As shown in FIG. 9, the semiconductor device 300 of the present embodiment includes a vertical Hall element 13 and a resistive element 23. The vertical Hall element 13 has a vertical Hall element part 13*a* including a plurality of electrodes 131*a* to 135*a* disposed at intervals on a straight line L5*a*-L5*a*, and a vertical Hall element part 13*b* including a plurality of electrodes 131*b* to 135*b* disposed at intervals on a straight line L5*b*-L5*b*. The resistive element 23 has a resistive element part 23*a* including a plurality of electrodes 231*a* to 235*a* disposed at intervals on a straight line L6*a*-L6*a*, and a resistive element part 23*b* including a plurality of electrodes 231*b* to 235*b* disposed at intervals on a straight line L6*b*-L6*b*.

In the semiconductor device 300 of the present embodiment, the electrodes 131*a* to 135*a* of the vertical Hall element part 13*a*, the electrodes 131*b* to 135*b* of the vertical Hall element part 13*b*, the electrodes 231*a* to 235*a* of the resistive element part 23*a*, and the electrodes 231*b* to 235*b* of the resistive element part 23*b* are disposed so that intervals between three adjacent electrodes at the center are all D4 and intervals between electrodes at both ends and one electrode on the inner side are all D5 which is smaller than D4, and the vertical Hall element part 13*a*, the vertical Hall element part 13*b*, the resistive element part 23*a*, and the resistive element part 23*b* have substantially the same structure.

In addition, for the vertical Hall element parts 13a and 13b, the conductive line W1 is connected to the electrodes 131a, 131b, 135a, and 135b, the conductive line W2 is connected to the electrodes 132a and 132b, the conductive line W3 is connected to the electrodes 133a and 133b, and the conductive line W4 is connected to the electrodes 134a and 134b. In this state, which is not shown, and in which the resistive element 23 is not connected to the vertical Hall element 13, a resistance between the electrodes 133a and 133b of the vertical Hall element 13, and the electrodes 131a and 131b and the electrodes 135a and 135b is smaller than a resistance between the electrodes 132a and 132b, and the electrodes 134a and 134b.

In the present embodiment, as shown in FIG. 9, the electrodes 231a and 235a of the resistive element part 23a are connected to the electrodes 133a and 133b of the vertical Hall element 13 with the conductive line W3, the electrode 233b of the resistive element part 23b is connected to the electrodes 131a, 131b, 135a, and 135b of the vertical Hall element 13 with the conductive line W1, and additionally, a conductive line W5 is connected to the electrode 233a of the resistive element part 23a, and a conductive line W6 is connected to the electrodes 231b and 235b of the resistive element part 23b.

In this manner, in order to explain the effect obtained by connecting the resistive element 23 to the vertical Hall element 13, a method of driving the vertical Hall element 13 using the spinning current method in the semiconductor device 300 will be described below in detail.

Figure 10:
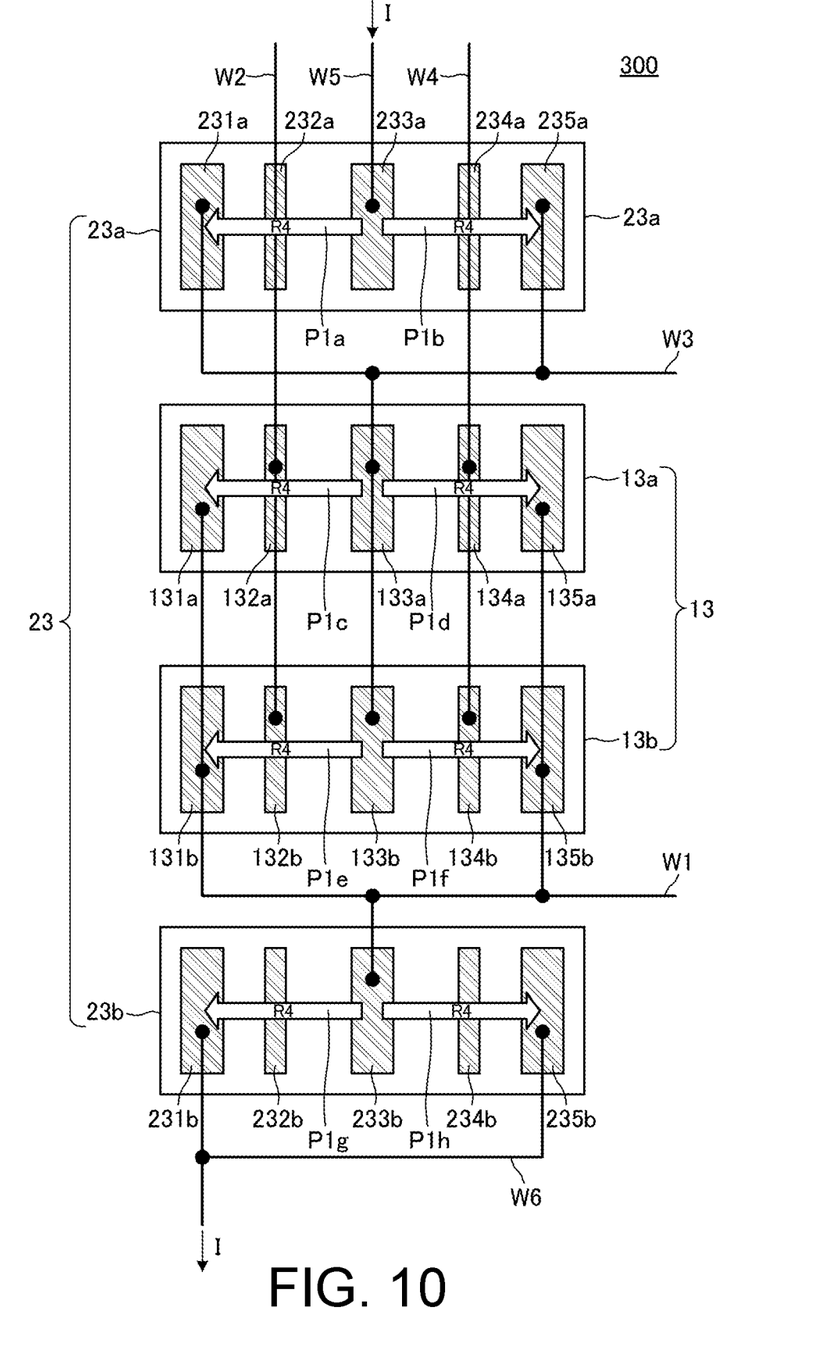
FIG. 10 is a schematic plan view for explaining a current path in which a direction of a current flowing through the vertical Hall element is set to a first state (a phase 1) in execution of the spinning current method in the semiconductor device shown in FIG. 9 is performed.
Figure 11:
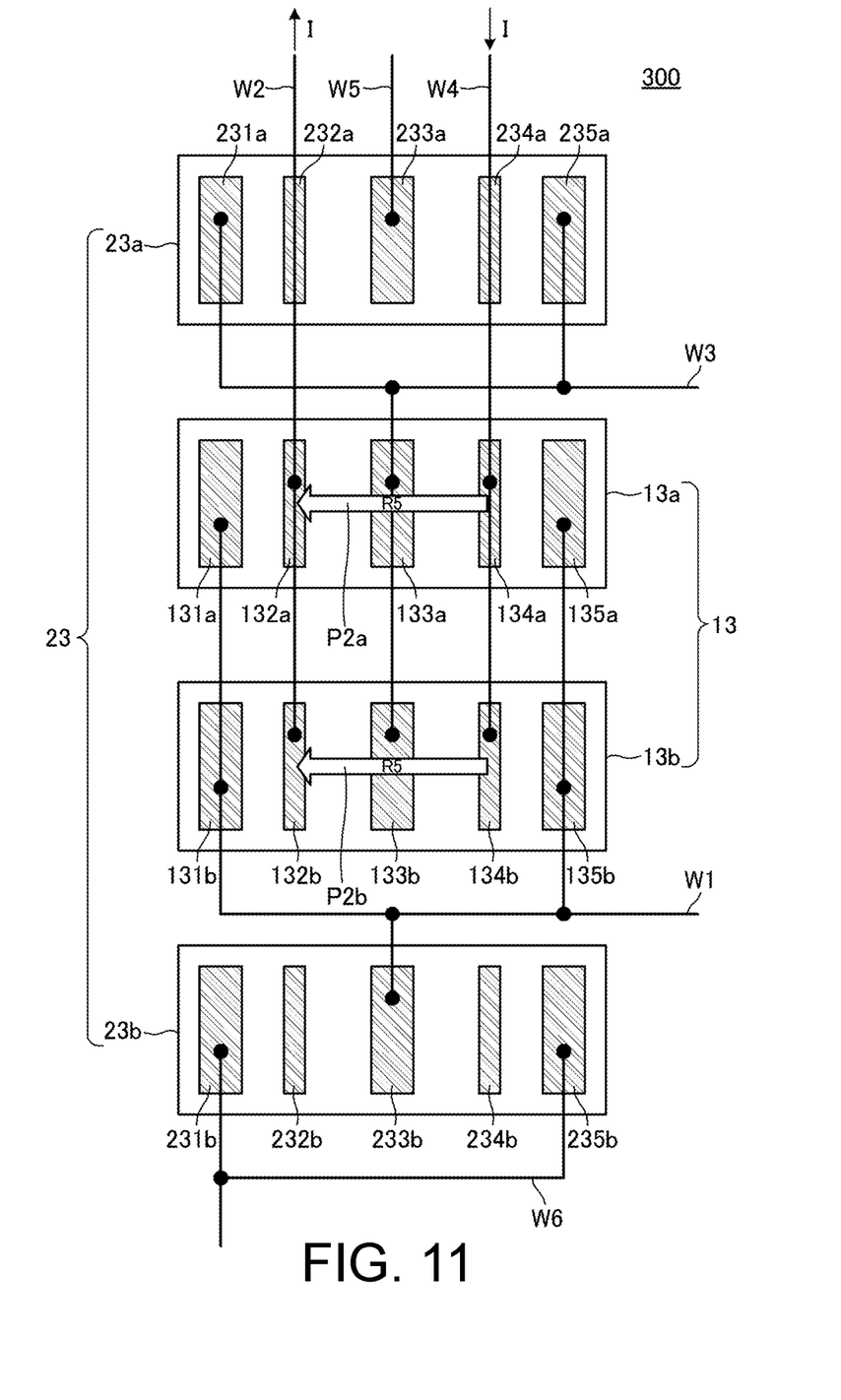
FIG. 11 is a schematic plan view for explaining a current path in which a direction of a current flowing through the vertical Hall element is set to a second state (a phase 2) in execution of the spinning current method in the semiconductor device shown in FIG. 9 is performed.

FIG. 10 and FIG. 11 are schematic plan views for explaining a current path in which a direction of a current flowing through the vertical Hall element 13 is set to a first state (a phase 1) and a second state (a phase 2) in execution of the spinning current method in the semiconductor device 300.

Here, cross-sectional structures of devices of the vertical Hall element part 13a, the vertical Hall element part 13b, the resistive element part 23a, and the resistive element part 23b in the present embodiment are substantially the same as those of the vertical Hall element 11 and the resistive element 21 in the first embodiment shown in FIG. 4 and FIG. 5 except for different intervals between electrodes, and descriptions thereof will be omitted here.

As shown in FIG. 10, in the phase 1, the drive current I is supplied from the conductive line W5 to the conductive line W6 so that the current flows from the electrodes 133a and 133b to the electrodes 131a and 131b and the electrodes 135a and 135b of the vertical Hall element 13. The current path P1 in the phase 1 includes the current path P1a along which current flows from the electrode 233a to the electrode 231a in the resistive element part 23a, the current path P1b along which current flows from the electrode 233a to the electrode 235a in the resistive element part 23a, the current path P1c along which current flows from the electrode 133a to the electrode 131a in the vertical Hall element part 13a, the current path P1d along which current flows from the electrode 133a to the electrode 135a in the vertical Hall element part 13a, a current path P1e along which current flows from the electrode 133b to the electrode 131b in the vertical Hall element part 13b, a current path P1f along which current flows from the electrode 133b to the electrode 135b in the vertical Hall element part 13b, a current path P1g along which current flows from the electrode 233b to the electrode 231b in the resistive element part 23b, and a current path P1h along which current flows from the electrode 233b to the electrode 235b in the resistive element part 23b. More specifically, the current path P1 is constructed from a series connection of a parallel path including the current paths P1a and P1b, a parallel path including the current paths P1c, P1d, P1e, and P1f, and a parallel path including the current paths P1g and P1h.

In the present embodiment, since the electrodes 131a to 135a of the vertical Hall element part 13a, the electrodes 131b to 135b of the vertical Hall element part 13b, the electrodes 231a to 235a of the resistive element part 23a, and the electrodes 231b to 235b of the resistive element part 23b are disposed at the intervals described above, a distance between electrodes (between 132a and 134a, between 132b and 134b, between 232a and 234a, and between 232b and 234b) positioned on both sides of the central electrode in one vertical Hall element part or the resistive element part is longer than a distance between the central electrodes 133a, 133b, 233a, and 233b, and the electrodes 131a, 131b, 231a, and 231b, or 135a, 135b, 235a, and 235b at the end. Since the width of the electrodes positioned on both sides of the central electrode is narrow, the resistance between the central electrode and the electrode at the end is smaller than the resistance between electrodes positioned on both sides of the central electrode. These resistances are substantially the same and are set as R4 here.

The resistance of the current path P1 is a series resistance of a parallel resistance R4/2 of the resistance R4 of the current path P1a and the resistance R4 of the current path P1b, a parallel resistance R4/4 of the resistance R4 of the current path P1c, the resistance R4 of the current path P1d, the resistance R4 of the current path P1e, and the resistance R4 of the current path P1f, and a parallel resistance R4/2 of the resistance R4 of the current path P1g and the resistance R4 of the current path P1h, and therefore becomes (5×R4)/4. In this case, a potential difference generated between the conductive line W2 and the conductive line W4, that is, between the electrodes 132a and 132b and the electrodes 134a and 134b of the vertical Hall element 13, is set as an output signal in the phase 1.

On the other hand, as shown in FIG. 11, in the phase 2, the drive current I is supplied from the conductive line W4 to the conductive line W2 so that the current flows from the electrodes 134a and 134b to the electrodes 132a and 132b of the vertical Hall element 13. The current path P2 in the phase 2 is constructed from the current path P2a along which current flows from the electrode 134a to the electrode 132a in the vertical Hall element part 13a and the current path P2b along which current flows from the electrode 134b to the electrode 132b in the vertical Hall element part 13b, both of which are connected in parallel.

In the present embodiment, as described above, the resistance between electrodes positioned on both sides of the central electrode is larger than the resistance R4 between the central electrode and the electrode at the end. These resistances are substantially the same and are set as R5 here. In addition, R4:R5=2:5 is supposed.

The resistance of the current path P2 is a parallel resistance of the resistance R5 of the current path P2a and the resistance R5 of the current path P2b, and therefore becomes R5/2. As described above, since R4:R5=2:5 is supposed, the resistance R5/2 of the current path P2 can be made equal to the resistance (5×R4)/4 of the current path P1 in the phase 1. In this case, a potential difference generated between the conductive line W1 and the conductive line W3, that is, between the electrodes 131a and 131b, and 135a and 135b, and the electrodes 133a and 133b, is set as an output signal in the phase 2.

In addition, although not shown, the resistance of the current path P3 in the third state (a phase 3) in which the drive current is supplied to the vertical Hall element 13 in a direction opposite to that of the phase 1 shown in FIG. 10 can be made approximately equal to resistances of the current path P1 and the current path P2. In this case, the potential difference generated between the conductive line W2 and the conductive line W4, that is, between the electrodes 132a and 132b and the electrodes 134a and 134b, is set as an output signal in the phase 3. In addition, a resistance of the current path P4 in the fourth state (a phase 4) in which the drive current is supplied to the vertical Hall element 13 in a direction opposite to that of the phase 2 shown in FIG. 11 can be made approximately equal to resistances of the current paths P1, P2, and P3. In this case, the potential difference generated between the conductive line W1 and the conductive line W3, that is, between the electrodes 131a and 131b, and 135a, and 135b, and the electrodes 133a and 133b, is set as an output signal in the phase 4.

In this manner, according to the present embodiment, since the electrode 231a and the electrode 235a of the resistive element part 23a are connected to the electrodes 133a and 133b of the vertical Hall element 13, and the electrode 233b of the resistive element part 23b is connected to the electrodes 131a, 131b, 135a, and 135b of the vertical Hall element 13, and additionally, the conductive line W5 is connected to the electrode 233a of the resistive element part 23a and the conductive line W6 is connected to the electrode 231b and the electrode 235b of the resistive element part 23b, all of the resistances of the current path P1 in the phase 1, the resistance of the current path P2 in the phase 2, the resistance of the current path P3 in the phase 3 and the resistance of the current path P4 in the phase 4 can be made substantially equal to each other.

In the present embodiment also, addition and subtraction of the four output signals obtained from each of the phases enables removal of the offset voltage with high accuracy.

While the embodiments of the invention have been described above, the invention is not limited to the above embodiments, and it should be noted that various modifications can be made without departing from the sprit and scope of the invention.

For example, in FIGS. 1 to 11 for explaining the first to third embodiments, the resistive element is disposed in parallel to the vertical Hall element on the drawings. However, the resistive element can be disposed in any direction, such as in a direction perpendicular to the vertical Hall element.

While the vertical Hall element including two vertical Hall element parts has been exemplified in the second and third embodiments, the vertical Hall element may include three or more vertical Hall element parts.

While the resistive element including two resistive element parts has been exemplified in the third embodiment, the resistive element may include three or more resistive element parts.

The vertical Hall element and the resistive element do not necessarily have the same structure, and the resistive element may have a structure different from that of the vertical Hall element as long as it can be connected to the vertical Hall element so that resistances of current paths in phases when the spinning current method is performed can be equal to each other.

In the first to third embodiments, a current path between two electrodes with one electrode therebetween in the resistive element, that is, a current path equivalent to a current path of the current flowing through the vertical Hall element, is connected to the vertical Hall element in parallel or in series. However, it is sufficient to appropriately connect the resistive element to the vertical Hall element so that resistances of current paths in phases are made equal to each other in execution of the spinning current method in the vertical Hall element. For example, a current path between two adjacent electrodes in the resistive element can be connected to the vertical Hall element in parallel or in series.

While the resistive elements 21 to 23 that are provided as dedicated resistive elements have been exemplified in the first to third embodiments, the embodiments of the invention are not limited thereto. For example, in the first embodiment, a vertical Hall element or a horizontal Hall element that is separately provided from the vertical Hall element 11 and is not used as a detecting element during detection of a magnetic field by the vertical Hall element 11 may be used as a resistive element in place of the resistive element 21.

While the vertical Hall element or the vertical Hall element part each including five electrodes has been exemplified in the first to third embodiments, the number of electrodes is not limited as long as it is possible to remove an offset voltage using the spinning current method.

In the first to third embodiments, the first conductive type is described as P type, and the second conductive type is described as N type. However, the conductive type may be changed, for example, the first conductive type may be set as N type, and the second conductive type may be set as P type.

What is claimed is:

1. A semiconductor device, comprising:
    a vertical Hall element provided in a first region of a semiconductor substrate and having a plurality of first electrodes, the plurality of first electrodes including at least five electrodes disposed at intervals on a straight line; and
    a resistive element provided in a second region different from the first region of the semiconductor substrate, having substantially the same structure as the vertical Hall element, and having a plurality of second electrodes, wherein
    three electrodes of the plurality of first electrodes are connected such that a current path from an electrode at one end of the three electrodes to a central electrode is in parallel with a current path from an electrode at the other end to the central electrode, so as to form a first current path used in a spinning current method,
    two electrodes other than the three electrodes of the plurality of first electrodes are connected such that a current path between the two electrodes of the plurality of first electrodes is in parallel with a current path between two electrodes of the plurality of second electrodes of the resistive element, so as to form a second current path used in the spinning current method, and
    a resistance of the first current path is substantially the same as a resistance of the second current path.

2. The semiconductor device according to claim 1, wherein the plurality of first electrodes comprises a plurality of third electrodes and a plurality of fourth electrodes equal in number to the plurality of third electrodes; and
    the vertical Hall element comprises a first vertical Hall element part having the plurality of third electrodes and a second vertical Hall element part having the plurality of fourth electrodes.

3. The semiconductor device according to claim 2, wherein the first vertical Hall element part, the second vertical Hall element part, and the resistive element have substantially the same structure.

4. The semiconductor device according to claim 1, wherein the plurality of second electrodes comprises a plurality of fifth electrodes and a plurality of sixth electrodes equal in number to the plurality of fifth electrodes; and the resistive element comprises a first resistive element part having the plurality of fifth electrodes and a second resistive element part having the plurality of sixth electrodes.

5. The semiconductor device according to claim 4, wherein the vertical Hall element, the first resistive element part, and the second resistive element part have substantially the same structure.

6. The semiconductor device according to claim 2, wherein the plurality of second electrodes comprises a plurality of fifth electrodes and a plurality of sixth electrodes equal in number to the plurality of fifth electrodes; and the resistive element comprises a first resistive element part having the plurality of fifth electrodes and a second resistive element part having the plurality of sixth electrodes.

7. The semiconductor device according to claim 6, wherein the first vertical Hall element part, the second vertical Hall element part, the first resistive element part, and the second resistive element part have substantially the same structure.

8. The semiconductor device according to claim 1, wherein the two current paths between neighboring electrodes of the three electrodes connected in parallel in the first current path have substantially the same resistances.

9. The semiconductor device according to claim 1, wherein the current path between the two electrodes of the plurality of first electrodes and the current path between the two electrodes of the plurality of second electrodes connected in parallel in the second current path have substantially the same resistances.

10. The semiconductor device according to claim 1, wherein at least one interval between the electrodes of the plurality of first electrodes is not the same.

* * * * *